(12) United States Patent
Scott

(10) Patent No.: US 8,866,645 B2
(45) Date of Patent: Oct. 21, 2014

(54) METHOD AND APPARATUS FOR COMPRESSION OF GENERALIZED SENSOR DATA

(71) Applicant: The Boeing Company, Seal Beach, CA (US)

(72) Inventor: James P. Scott, Manhattan Beach, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 13/633,274

(22) Filed: Oct. 2, 2012

(65) Prior Publication Data
US 2014/0091953 A1 Apr. 3, 2014

(51) Int. Cl.
*H03M 7/30* (2006.01)
*H03M 7/40* (2006.01)
*H04N 19/17* (2014.01)

(52) U.S. Cl.
CPC ......... *H03M 7/4006* (2013.01); *H04N 19/0026* (2013.01)
USPC .............................. 341/51; 341/107; 382/244

(58) Field of Classification Search
USPC ........... 341/51, 67, 76, 77; 382/239, 244–247
See application file for complete search history.

(56) References Cited

U.S. PATENT DOCUMENTS 5,045,853 A * 9/1991 Astle et al. ...................... 341/67
5,836,982 A * 11/1998 Muhlenberg et al. ............ 607/9
7,218,784 B1 * 5/2007 Zeck et al. ................... 382/232
8,558,724 B2 * 10/2013 Harada et al. .................. 341/50
2012/0128162 A1 * 5/2012 Chen et al. ..................... 381/22

FOREIGN PATENT DOCUMENTS

WO 2006060224 A1 6/2006

OTHER PUBLICATIONS

Hua Ye et al., A Lossless Image Compression System Using a Binary Arithmetic Coder, 1998 Fourth International Conference on Signal Processing Proceedings, 1998. ICSP '98, pp. 819-822 vol. 1, Date : Oct. 1998 Print ISBN: 0-7803-4325-5, INSPEC Accession No. 6357676.*
Extended European Search Report of Application No. 13182594; Nov. 18, 2013; 6 pages.
Cagnazzo, M. et al.; Region-Based Transform Coding of Multispectral Images; IEEE Transaction on Image Processing; Dec. 2007; pp. 2916-2926; vol. 16, No. 12.
Cagnazzo, M. et al.; Compression of Multitemporal Remote Sensing Images through Bayesian Segmentation; IEEE Geoscience and Remote Sensing Symposium 2004; pp. 281-284; IEEE.
Wagstaff, K.L., et al., "Science-Based Region-Of-Interest Image Compression," Jet Propulsion Laboratory.
Iqbal, Muhammad Imran, et al., "On Region of Interest Coding for Wireless Imaging," Blekinge Institute of Technology.
Dolinar, Sam, et al., "Region-of-Interest Data Compression with Prioritized Buffer Management," Jet Propulsion Laboratory, California Institute of Technology.

* cited by examiner

*Primary Examiner* — Howard Williams
(74) *Attorney, Agent, or Firm* — Armstrong Teasdale LLP

(57) ABSTRACT

Methods and apparatus for compression of generalized sensor data are described. One example method for use in compression of generalized sensor data at a first location for transmission to a second location includes analyzing the sensor data to identify high interest data and low interest data, and compressing the high interest data with a lossless compression algorithm.

11 Claims, 3 Drawing Sheets

METHOD AND APPARATUS FOR COMPRESSION OF GENERALIZED SENSOR DATA

BACKGROUND

The field of the disclosure relates generally to compression of sensor data, and more particularly relates to methods and apparatus for compression of aerial and/or satellite generalized sensor data.

Satellites often contain numerous sensors for gathering significant amounts of information. For example, some satellites include imaging sensors for recording digital images and/or video of, for example, terrestrial locations in visible and invisible spectra. Some satellites include radar systems and sensors for collecting terrestrial and/or weather data. Satellites communicate data collected from their sensors by wireless transmission to terrestrial locations and/or other satellites. The available wireless transmission bandwidth is limited and the amount of data collected by satellites is relatively large. Accordingly delays in transmission of sensor data from satellites may occur.

BRIEF DESCRIPTION

According to one aspect of the present disclosure, a method for use in compression of sensor data at a first location for transmission to a second location includes analyzing the sensor data to identify high interest data and low interest data, and compressing the high interest data with a lossless compression algorithm.

Another aspect of the present disclosure is a system for use in compression of sensor data at a first location for transmission to a second location. The system includes an input adapted to receive sensor data from at least one sensor, a memory device, and a processor communicatively coupled to the input and the memory device. The processor is configured to analyze the sensor data to identify high interest data and low interest data, and compress the high interest data with a multi-stage lossless compression algorithm.

Yet another aspect of the present disclosure is a system including at least one sensor configured to generate sensor data, a transmission system configured to transmit compressed sensor data to another location, and a compression system coupled to the sensor and the transmission system. The compression system is configured to receive the sensor data from the sensor, analyze the sensor data to identify high interest data and low interest data, compress the high interest data with a multi-stage lossless compression algorithm to produce compressed sensor data, and provide the compressed sensor data to said transmission system.

DETAILED DESCRIPTION

As used herein, an element or step recited in the singular and proceeded with the word "a" or "an" should be understood as not excluding plural elements or steps unless such exclusion is explicitly recited. Furthermore, references to "one embodiment" of the present invention or the "exemplary embodiment" are not intended to be interpreted as excluding the existence of additional embodiments that also incorporate the recited features.

The exemplary methods and systems described herein relate to compression of generalized sensor data. More particularly the exemplary embodiments provide for compression of aerial and/or satellite sensor data. In general, the exemplary embodiments prioritize sensor data according to levels of interest, apply lossless compression to high interest generalized data, either discard or apply progressive or lossy compression to low interest generalized data, and transmit the data of higher interest with a higher precedence than data with lower levels of interest. As a result, bandwidth bottlenecks in transmission of satellite and/or aerial sensor data may be avoided. Although the methods and apparatus are described herein with reference to satellites, they may be applied to any platform for which data compression as described herein is appropriate, including, for example, aircraft and other aerial systems. Further, the embodiment described herein may be applied in a generalized manner to all types of sensor data, as opposed to only data produced by a specific sensor type (e.g. imaging sensor, RADAR sensor, radiation sensor, weather sensors).

The methods and systems described herein may be implemented using computer programming or engineering techniques including computer software, firmware, hardware or any combination or subset thereof, wherein an exemplary technical effect may include at least one of: (a) analyzing sensor data to identify high interest data and low interest data, (b) compressing the high interest data with a lossless compression algorithm, and (c) compressing the low interest data with a progressive or lossy compression algorithm.

Figure 1:
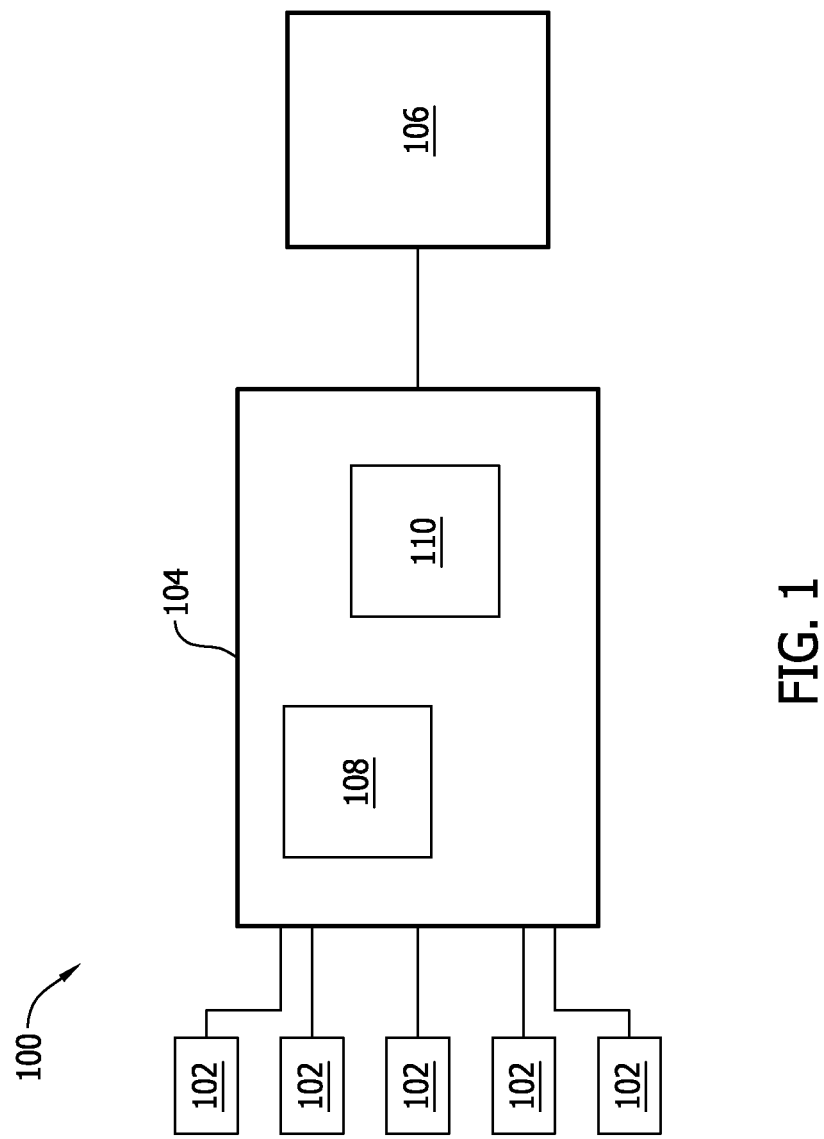
FIG. 1 is a block diagram of a portion of an exemplary satellite system.

Referring more particularly to the drawings, FIG. 1 is a block diagram of a portion of an exemplary satellite 100. As used herein, the term satellite includes any terrestrial orbiting platform. Satellite 100 includes sensors 102. Data from sensors 102 is transmitted to compression system 104. Compression system 104 outputs compressed data from sensors 102 to transmission system 106. Transmission system 106 transmits the compressed data to another location, such as another satellite, a terrestrial location, etc. Although sensors 102, compression system 104, and transmission system 106 are illustrated as separate components, in some embodiments the capabilities, functions, and/or components two or more are combined in a single component. For example, compression system 104 and transmission system 106 are combined in some embodiments. Moreover, in some embodiments, compression system 104 and/or transmission system 106 are embodied in another system, such as a central controller.

Sensors 102 are any type(s) of sensors for which sensor data compression may be beneficial. Sensors 102 may all be the same type of sensor or one or more sensors 102 may differ from one or more other sensors 102. In some embodiments, sensors 102 include imaging sensors. Imaging sensors can include video and/or still image sensors configured to capture video and/or still images in the visible or invisible spectra. In some embodiments, sensors 102 include radar systems.

Compression system 104 includes a processor 108 and a memory device 110. Processor 108 is in communication with memory device 110. Memory device 110 is any suitable device that may be used for storing and/or retrieving information, such as executable instructions and/or data. Memory device 110 may include any computer readable medium, such as hard disk storage, optical drive/disk storage, removable disk storage, flash memory, random access memory (RAM), etc. While memory device 110 is illustrated as a single element in FIG. 1, it should be appreciated that memory device 110 may include one or multiple separate memory devices, located together or remote from one another.

Processor 108 may include one or more processing units (e.g., in a multi-core configuration). The term processor, as used herein, refers to central processing units, microprocessors, microcontrollers, reduced instruction set circuits (RISC), application specific integrated circuits (ASIC), logic circuits, and any other circuit or processor capable of executing instructions. Processor 108 may be programmed, such as via instructions stored in memory device 110, to perform alone or in combination any of the processes, methods or functions described herein.

In operation, data from sensors 102 is transmitted to compression system 104. Compression system 104 analyzes the incoming data using any suitable data reduction techniques to identify regions of interest within the incoming data. In some embodiments, for example, compression system 104 performs principal component analysis (PCA). In some embodiments, compression system 104 performs cluster analysis (CA) on the sensor data. The reduced data set represents areas of interest (e.g., targets of interest) within the collected sensor data. For example, the areas of interest may include particular terrestrial geographic areas that are of high interest, or a particular weather feature of interest, etc. The analyzed data is input to a multi-stage compression/decompression (CODEC) algorithm to compress the analyzed data. Some or all of the compressed data is provided to transmission system 106 for transmission to another location as will be described in more detail below.

Figure 2:
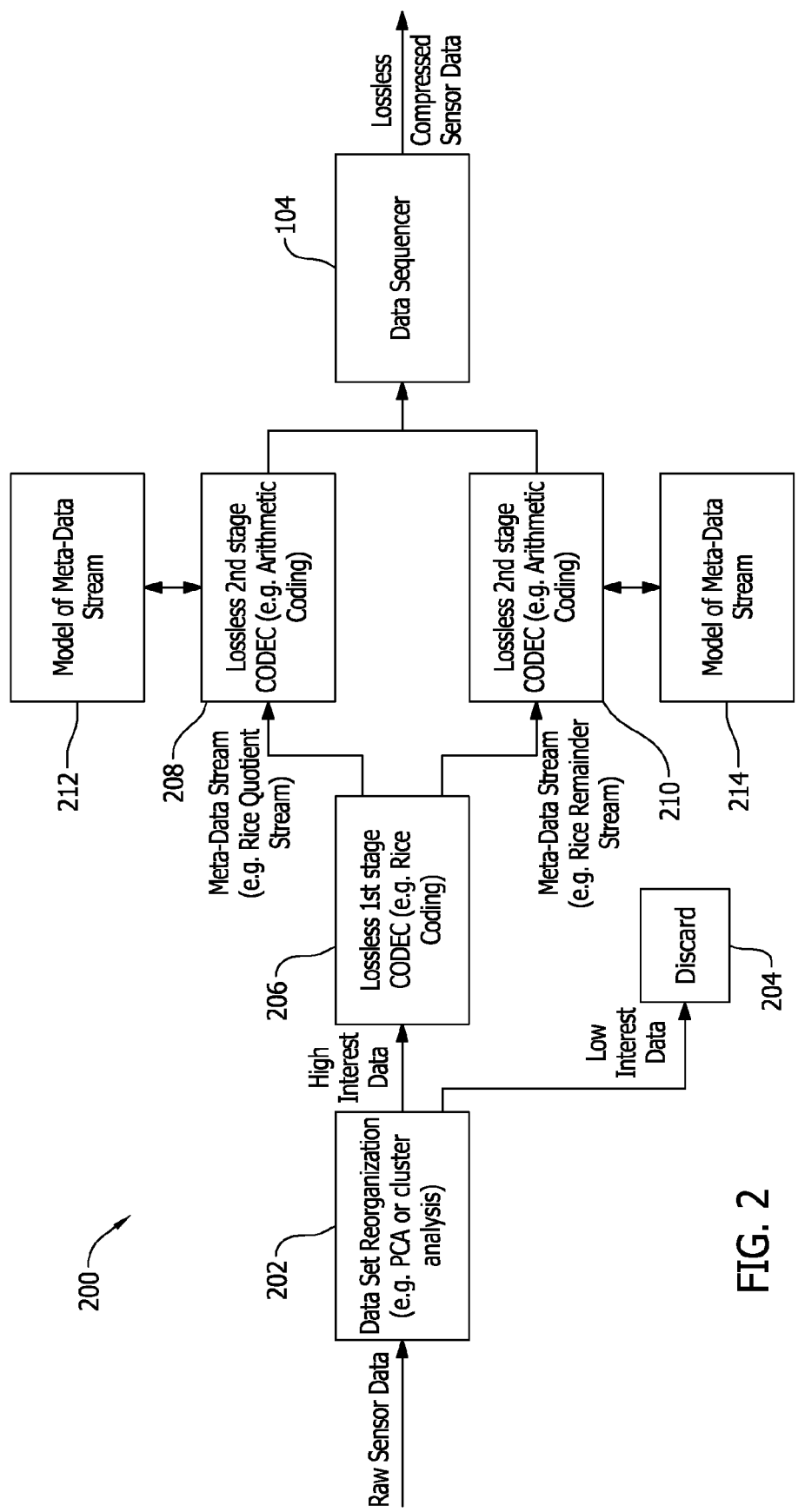
FIG. 2 is a functional block diagram of an exemplary compression procedure that may be used in the system shown in FIG. 1.

FIG. 2 is a functional block diagram 200 of an exemplary compression procedure performed by compression system 104. As described above, data from sensors 102 is received by compression system 104. At block 202, the sensor data set is reorganized using any suitable technique for identifying high interest data. In some embodiments, the data set is reorganized using PCA and/or CA. The data set reorganization results in a high interest region data set and a low interest regions data set. The low interest data set is discarded at block 204. The high interest data set is input to a multi-stage CODEC algorithm. In the first stage, at block 206, the high interest region data set is processed using a lossless CODEC algorithm that compresses all of the bits in the high interest region data set. In the exemplary embodiment, the lossless CODEC algorithm is a Rice Coding algorithm. In other embodiments, any other suitable lossless CODEC algorithm may be used, such as a sliding window algorithm, Lempel-Ziv-Welch algorithm, etc.

The result of the first stage compression is input to the second stage of the multi-stage CODEC. The second CODEC stage compresses high-entropy meta-data streams. In the exemplary embodiment, the output of the first stage includes two meta-data streams, the Rice quotient stream and the Rice remainder stream. Each of the two streams is subjected to a separate lossless second stage codec at blocks 208 and 210. In the exemplary embodiment, the second stage CODECs are arithmetic coding algorithms. Separate context models, at blocks 212 and 214, are used with the separate compression CODECs. By using separate context models, the second stage compression applied to each stream (i.e., the Rice quotient and the Rice remainder) can be maximized for that particular stream, rather than being an accommodation to both streams. In other embodiments any other suitable lossless CODEC algorithm may be used, including entropy encoding. At block 216 a data sequencer combines the results of the second stage compression and outputs the lossless compressed sensor data set.

Figure 3:
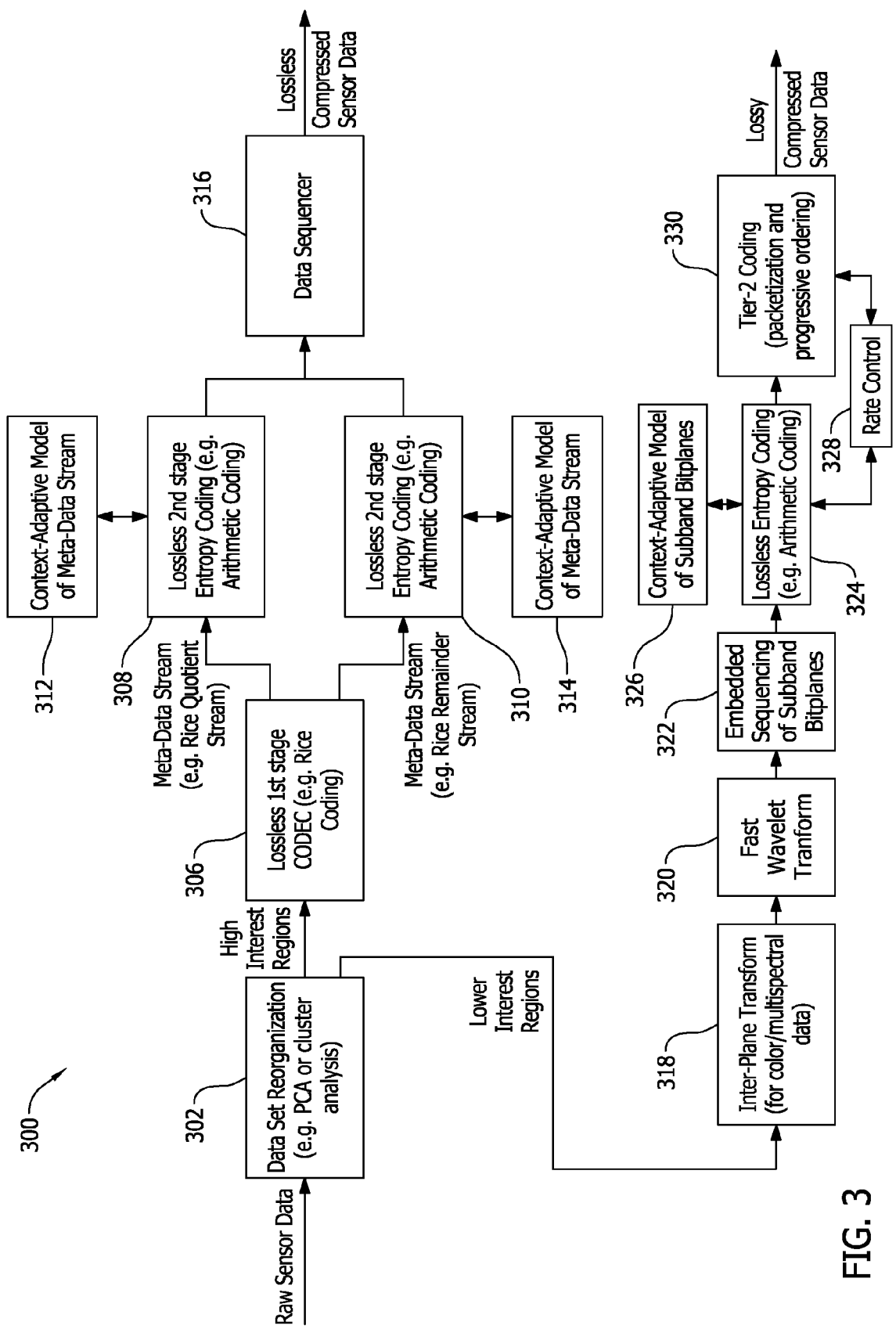
FIG. 3 is a functional block diagram of another exemplary compression procedure that may be used in the system shown in FIG. 1.

FIG. 3 is a functional block diagram 300 of an exemplary compression procedure performed by compression system 104. As described above, data from sensors 102 is received by compression system 104. At block 302, the sensor data set is reorganized using any suitable technique for identifying high interest data. In some embodiments, the data set is reorganized using PCA and/or CA. The data set reorganization results in a high interest region data set and a low interest regions data set.

The high interest data set is input to a multi-stage lossless CODC algorithm. In the first stage, at block 306, the high interest region data set is processed using a lossless CODEC algorithm that compresses all of the bits in the high interest region data set. In the exemplary embodiment, the lossless CODEC algorithm is a Rice Coding algorithm. In other embodiments, any other suitable lossless CODEC algorithm may be used, such as a sliding window algorithm, Lempel-Ziv-Welch algorithm, etc.

The result of the first stage compression of the high interest region data set is input to the second stage of the multi-stage CODEC. The second CODEC stage compresses high-entropy meta-data streams. In the exemplary embodiment, the output of the first stage includes two meta-data streams, the Rice quotient stream and the Rice remainder stream. Each of the two streams is subjected to a separate lossless second stage codec at blocks 308 and 310. In the exemplary embodiment, the second stage CODECs are arithmetic coding algorithms. Separate context models, at blocks 312 and 314, are used with the separate compression CODECs. For example, a first meta-data stream may be compressed using a first context model adapted to the first meta-data stream, and a second meta-data stream may be compressed using a second context model adapted to the second meta-data stream. By using separate context models, the second stage compression applied to each stream (i.e., the Rice quotient and the Rice remainder) can be maximized for that particular stream, rather than being an accommodation to both streams. In other embodiments any other suitable lossless CODEC algorithm may be used, including entropy encoding. At block 316, a data sequencer combines the results of the second stage compression and outputs the lossless compressed high interest region data set.

The low interest region data set is input to a multi-stage lossy CODEC algorithm. In the exemplary embodiment, the low interest data set is input to an inter-plane transform at block 318. The output is subjected to a fast wavelet transform, at block 320, which outputs to embedded sequencing of sub band bitplanes at block 322. At block 324, a lossless compression is applied to the low interest data set. In the exemplary embodiment, the lossless compression is entropy coding. In some embodiments, the lossless compression includes arithmetic coding. The lossless entropy coding utilizes a context-adaptive model of sub band bitplanes, at block 326. Rate control is provided at block 328. The output of the lossless compression is input to a tier-2 coding algorithm at block 330 for packetizing and progressive ordering before being output from the multi-stage lossy codec. The resulting output is a very highly compressed and very lossy low interest regions data set. The high compression of the low interest regions data set decreases the size of the data set, thereby reducing the bandwidth needed to transmit the data set. Moreover, the highly compressed low interest region data set may be stored, such as in memory device 110, for transmission at a later time when excess bandwidth is available.

The exemplary methods and systems described herein provide for compression of aerial and/or satellite generalized sensor data. Sensor data is prioritized according to levels of interest. The data of higher interest is transmitted with lossless compression and a higher precedence than data with lower levels of interest. As a result, bandwidth bottlenecks in transmission of satellite and/or aerial sensor data may be avoided.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated. This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method for use in compression of sensor data at a first location for transmission to a second location, said method comprising:
    analyzing the sensor data to identify high interest data and low interest data;
    processing the high interest data at a first stage of a lossless compression algorithm to create a first meta-data stream and a second meta-data stream;
    separately processing the first meta-data stream and the second meta-data stream at a second stage of the lossless compression algorithm, wherein the first meta-data stream is compressed using a first context model adapted to the first meta-data stream and the second meta-data stream is compressed using a second context model adapted to the second meta-data stream; and
    combining the processed first meta-data stream and the processed second meta-data stream to produce compressed sensor data.

2. A method in accordance with claim 1, further comprising sequencing the first meta-data stream and the second meta-data stream together for joint transmission from the first location to the second location.

3. A method in accordance with claim 1, further comprising discarding the low interest data.

4. A method in accordance with claim 1, further comprising compressing the low interest data with a lossy compression algorithm to produce lossy compressed low interest data.

5. A method in accordance with claim 4, wherein compressing the low interest data with a lossy compression algorithm comprises compressing the low interest data with a multi-stage lossy compression algorithm.

6. A method in accordance with claim 5, further comprising storing the lossy compressed low interest data for later transmission.

7. A system for use in compression of sensor data at a first location for transmission to a second location, said system comprising:
    an input adapted to receive sensor data from at least one sensor;
    a memory device; and
    a processor communicatively coupled to said input and said memory device, said processor configured to:
    analyze the sensor data to identify high interest data and low interest data;
    process the high interest data at a first stage of a multi-stage lossless compression algorithm to create a first meta-data stream and a second meta-data stream;
    separately process the first meta-data stream and the second meta-data stream at a second stage of the lossless compression algorithm, wherein the first meta-data stream is compressed using a first context model adapted to the first meta-data stream and the second meta-data stream is compressed using a second context model adapted to the second meta-data stream; and
    combine the processed first meta-data stream and the processed second meta-data stream to produce compressed sensor data.

8. A system in accordance with claim 7, wherein said processor is further configured to compress the low interest data with a multi-stage lossy compression algorithm to produce lossy compressed low interest data.

9. A system comprising:
    at least one sensor configured to generate sensor data;
    a transmission system configured to transmit compressed sensor data to another location;
    a compression system coupled to said sensor and said transmission system, said compression system configured to:
    receive the sensor data from said sensor;
    analyze the sensor data to identify high interest data and low interest data;
    process the high interest data at a first stage of a multi-stage lossless compression algorithm to create a first meta-data stream and a second meta-data stream;
    separately process the first meta-data stream and the second meta-data stream at a second stage of the lossless compression algorithm, wherein the first meta-data stream is compressed using a first context model adapted to the first meta-data stream and the second meta-data stream is compressed using a second context model adapted to the second meta-data stream; and
    combine the processed first meta-data stream and the processed second meta-data stream to produce compressed sensor data; and
    provide the compressed sensor data to said transmission system.

10. A system in accordance with claim 9, wherein said compression system is further configured to compress the low interest data with a multi-stage lossy compression algorithm to produce lossy compressed low interest data.

11. A system in accordance with claim 9, wherein said compression system is further configured to discard the low interest data.

* * * * *